United States Patent
Wang

(10) Patent No.: US 7,262,093 B2
(45) Date of Patent: Aug. 28, 2007

(54) STRUCTURE OF A NON-VOLATILE MEMORY CELL AND METHOD OF FORMING THE SAME

(75) Inventor: Tings Wang, Hsinchu (TW)

(73) Assignee: ProMOS Technologies, Inc. (TW)

( * ) Notice: Subject to any disclaimer, the term of this patent is extended or adjusted under 35 U.S.C. 154(b) by 54 days.

(21) Appl. No.: 10/891,076

(22) Filed: Jul. 15, 2004

(65) Prior Publication Data
US 2006/0011966 A1 Jan. 19, 2006

(51) Int. Cl.
*H01L 21/336* (2006.01)
*H01L 29/788* (2006.01)

(52) U.S. Cl. .................. 438/257; 257/317; 438/267
(58) Field of Classification Search ............... 257/317; 438/260, 257, 267
See application file for complete search history.

(56) References Cited

U.S. PATENT DOCUMENTS

| | | | |
|---|---|---|---|
| 6,525,371 B2 * | 2/2003 | Johnson et al. ............. 257/317 |
| 6,563,167 B2 * | 5/2003 | Chern ......................... 257/316 |
| 6,627,927 B2 * | 9/2003 | Wu .............................. 257/213 |
| 6,649,474 B1 * | 11/2003 | Lin et al. ..................... 438/266 |
| 6,649,967 B2 * | 11/2003 | Na et al. ..................... 257/315 |
| 6,706,602 B2 * | 3/2004 | Hsu et al. .................... 438/267 |
| 6,710,396 B1 * | 3/2004 | Wu .............................. 257/315 |
| 6,764,904 B1 * | 7/2004 | Liu et al. ..................... 438/259 |
| 6,958,273 B2 * | 10/2005 | Chen et al. .................. 438/259 |
| 2004/0209428 A1 * | 10/2004 | Lin ............................. 438/266 |
| 2004/0212009 A1 * | 10/2004 | Wang et al. ................ 257/317 |
| 2005/0064661 A1 * | 3/2005 | Lee et al. .................... 438/257 |
| 2005/0250315 A1 * | 11/2005 | Tran et al. ................... 438/637 |

* cited by examiner

*Primary Examiner*—Sara Crane
*Assistant Examiner*—Colleen Matthews
(74) *Attorney, Agent, or Firm*—Finnegan, Henderson, Farabow, Garrett & Dunner LLP

(57) ABSTRACT

A flash memory cell is provided. The flash memory cell includes a substrate having a source and a drain formed therein, a bit line contact formed above the drain, a control gate formed above the substrate, a spacer floating gate formed above the substrate and adjacent to the control gate, and a first spacer formed between the bit line contact and the control gate, wherein the first spacer is in contact with both the bit line contact and the control gate.

17 Claims, 10 Drawing Sheets

STRUCTURE OF A NON-VOLATILE MEMORY CELL AND METHOD OF FORMING THE SAME

TECHNICAL FIELD

This invention relates in general to a floating gate flash memory and the method of manufacture thereof and, more particularly, to a flash memory cell having a floating gate that includes a projection formed above a control gate thereof.

BACKGROUND INFORMATION

In recent years, flash memories such as floating gate flash memories have been widely used in electronic products such as digital cameras, camcorders, mobile phones, mobile computers, etc. Advantages of flash memories include non-volatility, i.e., information may be stored in the memory even when power supply is disconnected, and fast erasure speed. A floating gate flash memory may be manufactured on a semiconductor substrate and generally includes an array of memory cells each having a control gate and a floating gates. Electric charges may be stored in the floating gate, thereby changing a status of the respective memory cell. The structure of a conventional floating gate flash memory 100 is described in the following with reference to FIG. 1.

FIG. 1 shows a cross-sectional view of a part of floating gate memory 100 formed on a semiconductor substrate 102. A memory cell 104 of memory 100 as shown in FIG. 1 includes a source region 106 and a drain region 108 formed in substrate 102, a floating gate 110, and a control gate 112. A first layer of oxide 114 is formed between floating gate 110 and substrate 102. A protection layer 116 is formed above floating gate 110. A second layer of oxide 118 isolates control gate 112 from floating gate 110. A source line 120 is formed to provide contact to source region 106. An interlayer dielectric (ILD) 122 is formed above control gate 112, protection layer 116, and source line 120. ILD 122 has formed therein a via hole 124. A bit line contact 126 is formed to provide contact to drain region 108. A first spacer 128 is formed on sidewalls of floating gate 110 and protection layer 116 and isolates source line 120 from floating gate 110. A second spacer 130 is formed on a sidewall of control gate 112.

Problems associated with memory cell 104 as shown in FIG. 1 are that a thickness and a critical dimension (CD) of control gate 112 are hard to control during fabrication and that, because control gate 112 must be spaced apart from bit line contact 126 by a distance (indicated by "L" in FIG. 1) to avoid short circuit, a degree of integration is limited. Further, during the fabrication of memory 100, misalignments of masks used in photolithography steps may result in open circuits or short circuits, thus affecting yield of fabrication.

SUMMARY OF THE INVENTION

Accordingly, the present invention is directed to a novel flash memory and a manufacturing method thereof that obviate one or more of the problems due to limitations and disadvantages of the related art.

In accordance with the present invention, there is provided a flash memory cell that includes a substrate having a source and a drain formed therein, a bit line contact formed above the drain, a control gate formed above the substrate, a spacer floating gate formed above the substrate and adjacent to the control gate, and a first spacer formed between the bit line contact and the control gate, wherein the first spacer is in contact with both the bit line contact and the control gate.

In accordance with the present invention, there is also provided a flash memory cell that includes a substrate having a source and a drain formed therein, a bit line contact formed above the drain, a floating gate formed above the substrate, a control gate formed above at least a first portion of the substrate, a layer of dielectric formed between the control gate and the floating gate, wherein the floating gate includes a projection formed above a part of the first portion of the substrate and isolated from the control gate by the layer of dielectric.

In accordance with the present invention, there is still provided a flash memory including a plurality of memory cells. Each memory cell includes a substrate having a source and a drain formed therein, a bit line contact formed above the drain, a floating gate formed above the substrate, a control gate formed above at least a first portion of the substrate, a spacer formed between the control gate and the bit line contact, wherein the spacer is in contact with both the bit line contact and the control gate, and a layer of dielectric formed between the control gate and the floating gate, wherein the floating gate includes a projection formed above a part of the first portion of the substrate and isolated from the control gate by the layer of dielectric.

Also in accordance with the present invention, there is provided a method of forming a flash memory cell that includes forming a source and a drain in a substrate, forming a control gate above at least a first portion of the substrate, wherein the control gate has a first sidewall and a second sidewall, forming a first spacer on the first sidewall of the control gate, forming a second spacer on the second sidewall of the control gate, forming a bit line contact above the drain to provide a contact to the drain, wherein the bit line contact is in contact with the first spacer, and forming a floating gate above the substrate and in contact with the second spacer, wherein the floating gate includes a projection above a part of the first portion of the substrate.

Still in accordance with the present invention, there is provided a method of forming a flash memory that includes providing a substrate, forming a layer of gate dielectric, forming a plurality of composite structures above the gate dielectric, each composite structure including a first conductive pattern, a doped oxide pattern, and a nitride pattern, removing the nitride pattern in each composite structure, partially etching the first conductive patterns and the doped oxide patterns to form two control gates out of each first conductive pattern, forming a plurality of first spacers each on a first sidewall of one of the control gates, wherein each first spacer fully covers the first sidewall of the corresponding control gate, forming a plurality of second spacers each on a second sidewall of one of the control gates, partially removing the plurality of second spacers to expose a side of the doped oxide pattern and a portion of each control gate, forming a plurality of third spacers on the exposed portions of the control gates, forming a plurality of floating gates on the third spacers, and forming each of a plurality of bit line contacts between every two control gates formed out of one first conductive pattern.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the features, advantages, and principles of the invention.

In the drawings.

DESCRIPTION OF THE EMBODIMENTS

Reference will now be made in detail to embodiments of the present invention, examples of which are illustrated in the accompanying drawings. Wherever possible, the same reference numbers will be used throughout the drawings to refer to the same or like parts.

Embodiments consistent with the present invention provide for a novel floating gate flash memory and the manufacturing method thereof. The described method obviates the problems associated with misalignment during processing steps and the described memory cell has a faster erasure speed compared to conventional flash memory devices.

A manufacturing method of a flash memory 200 consistent with the present invention is now described with reference to FIGS. 2-19. Flash memory 200 may comprise an array of memory cells. To facilitate illustration, only two adjacent memory cells are described herein.

Figure 1:
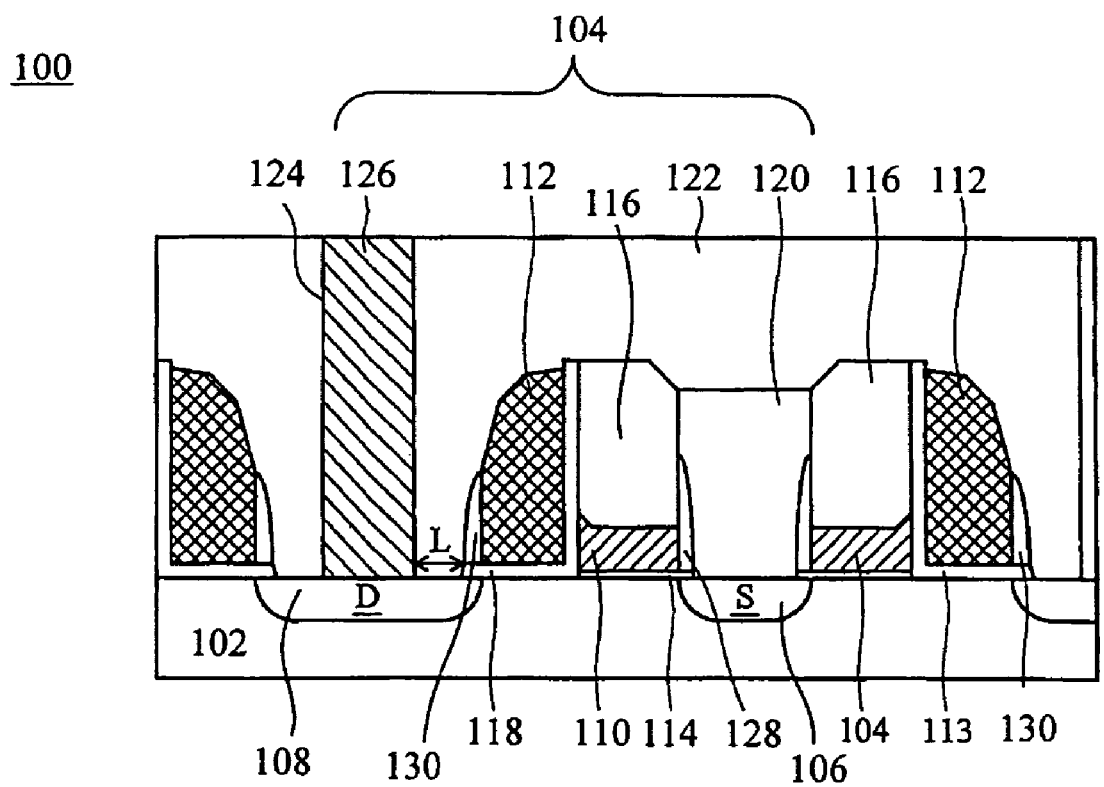
FIG. 1 shows a structure of a conventional floating gate memory device.
Figure 2:
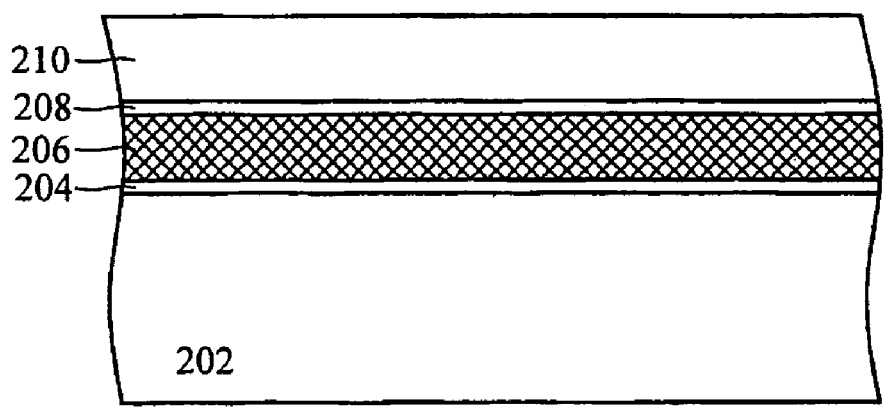
FIGS. 2-18 illustrate the steps of a manufacturing method of a flash memory consistent with the present invention.

Referring to FIG. 2, a semiconductor substrate 202, such as a silicon wafer, is first provided. A layer of gate dielectric 204, a conductive layer 206, a doped oxide layer 208, and a nitride layer 210 are sequentially provided above substrate 202. Gate dielectric 204 may comprise silicon dioxide. Conductive layer 206 may comprise metal or polysilicon. Doped oxide layer 208 may comprise a layer of silicon oxide doped with impurities, which generally has a high etching speed. In one aspect, doped oxide layer 208 is doped with boron. Nitride layer 210 may be used as a hard mask in later etching steps.

Figure 3:
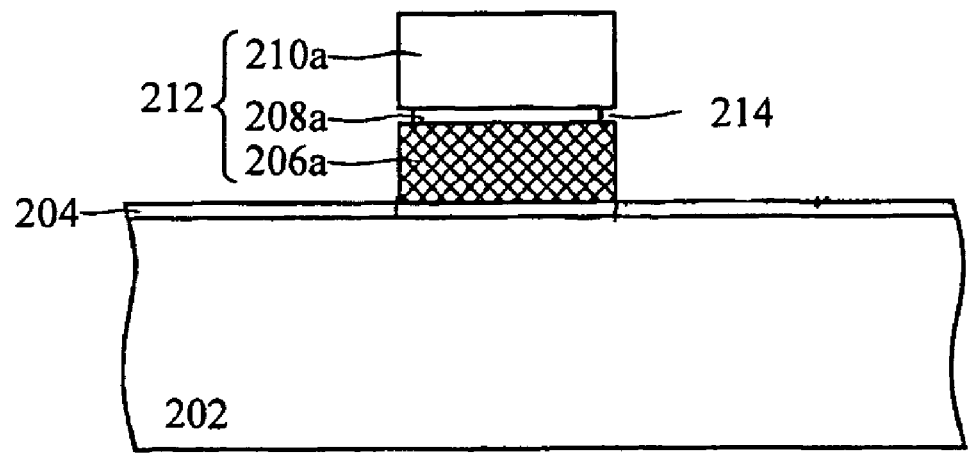

Referring to FIG. 3, nitride layer 210 is patterned to form nitride patterns 210a. Then, using patterns 210a as an etching mask, an anisotropic etching is performed to etch doped oxide layer 208 and conductive layer 206, forming doped oxide patterns 208a and conductive patterns 206a. The etching of doped oxide layer 208 and conductive layer 206 may comprise plasma etching or reactive ion etching (RIE). Thus, a plurality of composite structures 212 each including a conductive pattern 206a, a doped oxide pattern 208a, and a nitride pattern 210a are formed. To facilitate illustration, only one composite structure 212 is shown in the figures and described in the following.

Next, semiconductor substrate 202 with composite structure 212 formed thereon is dipped in a hydrofluoric (HF) solvent and therefore isotropically etched. Because oxide 208a is doped with impurities, an etching speed thereof in the HF solvent is higher than that of conductive pattern 206a and nitride pattern 210a. Thus, a recess 214 is formed at each side of doped oxide pattern 208a between nitride pattern 210a and conductive pattern 206a, as shown in FIG. 3.

Figure 4:
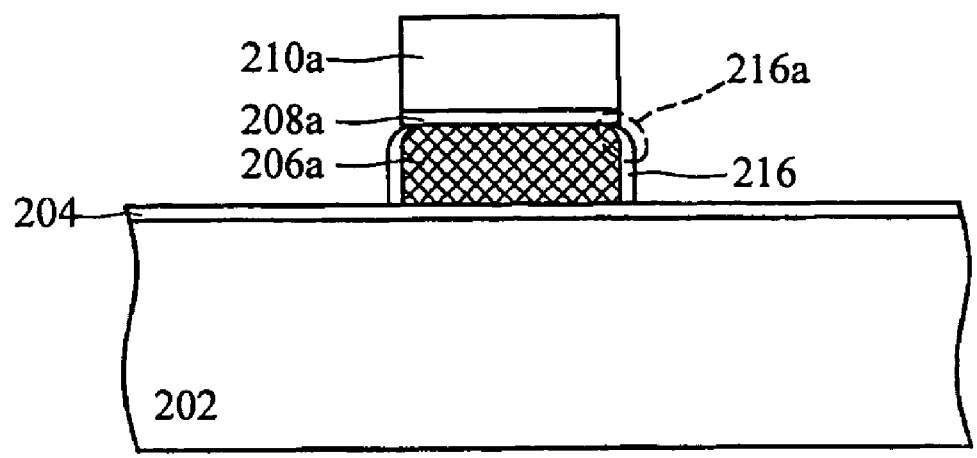

Referring to FIG. 4, a thermal oxidation is performed to form an oxide 216 on sidewalls of conductive pattern 206a. In one aspect, oxide 216 is formed at a temperature between 800° C. and 1100° C. Also, as shown in FIG. 4, oxide 216 includes a "bird's beak" 216a formed in recess 214.

Figure 5:
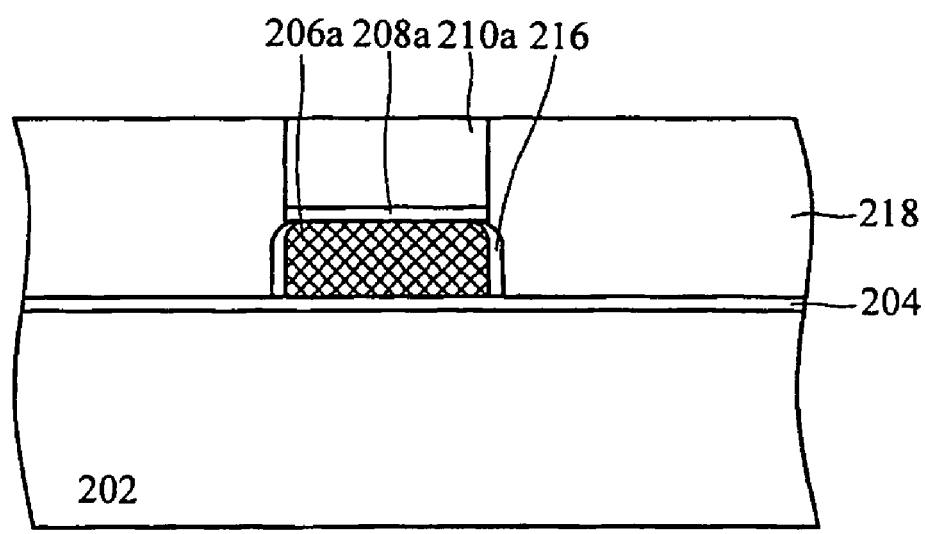

Referring to FIG. 5, after the formation of oxide 216, a sacrificial layer 218 is deposited above the entire surface of the resultant structure. In one aspect, sacrificial layer 218 comprises oxynitride. In another aspect, a thickness of sacrificial layer 218 is greater than a height of nitride pattern 210a above a surface of substrate 202. Sacrificial layer 218 is then polished and planarized by chemical-mechanical polishing (CMP), exposing nitride pattern 210a.

Figure 6:
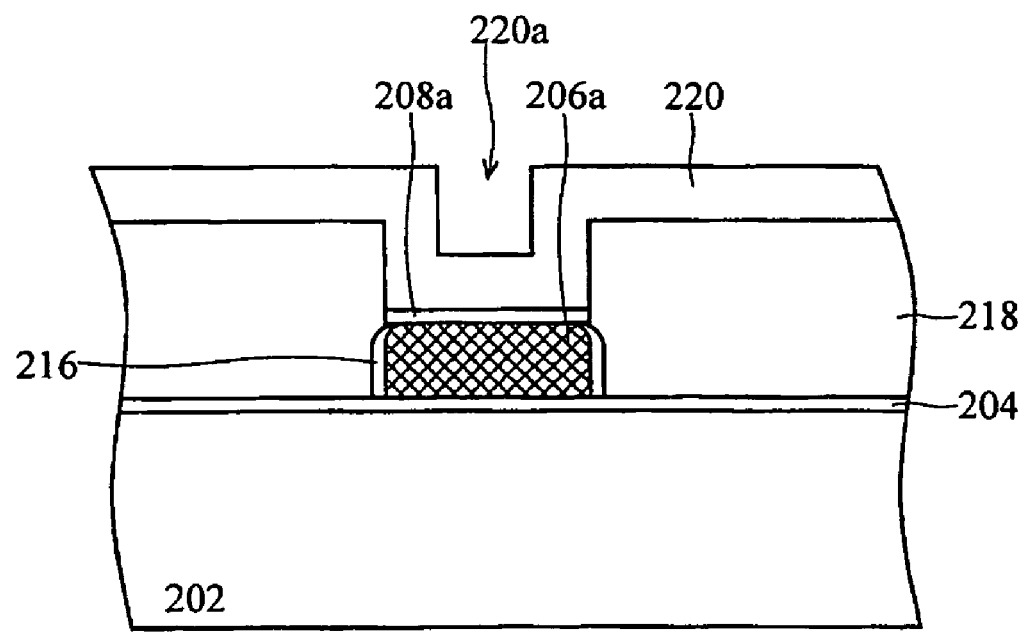

Next, as shown in FIG. 6, nitride pattern 210a is etched away. In one aspect, nitride pattern 210a is removed using phosphoric acid, which does not substantially etch doped oxide pattern 208a. After nitride pattern 210a is removed, an insulating layer 220 is deposited above the entire surface of the resultant structure. Insulating layer 220 also has an opening 220a therein, as shown in FIG. 6. In one aspect, insulating layer 220 comprises a nitride.

Figure 7:
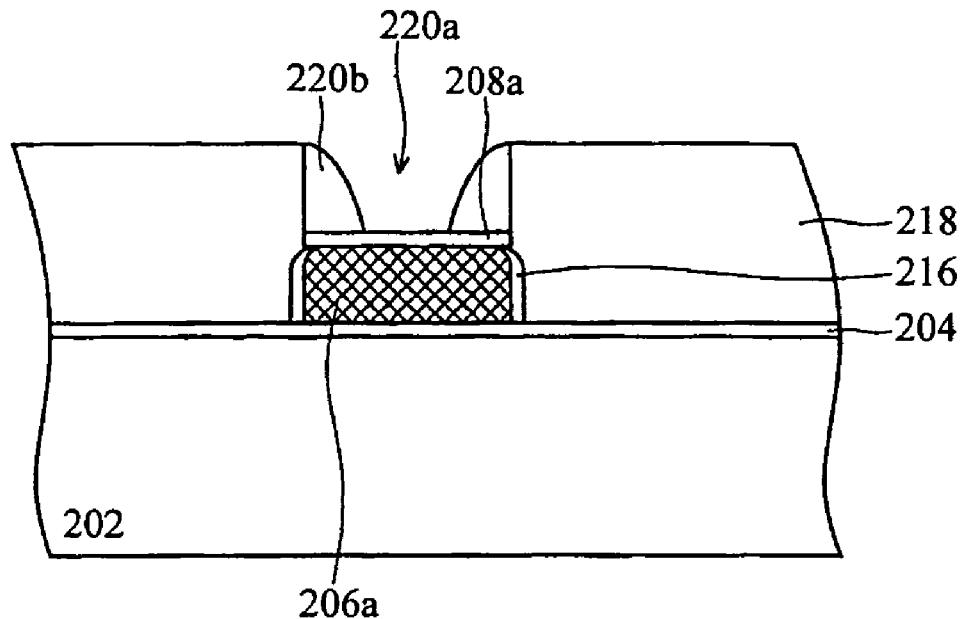

Referring to FIG. 7, an anisotropic etching, such as plasma etching or RIE, is performed to etch insulating layer 220 to expose a surface of sacrificial layer 218 and doped oxide pattern 208a. Consequently, spacers 220b are formed on sidewalls of opening 220a. In one aspect, insulating layer 220 is etched using plasma etching with $CHF_3$ or $NF_3$ as reaction gases.

Figure 8:
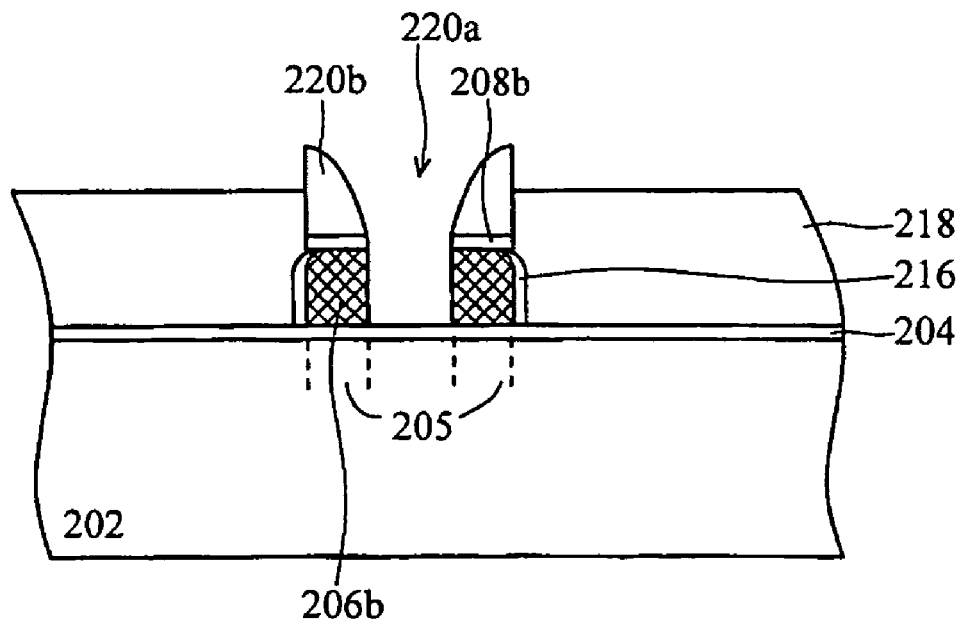

Referring to FIG. 8, doped oxide pattern 208a and conductive pattern 206a are anisotropically etched using spacers 220b and sacrificial layer 218 as an etching mask. As a result of the etching, gate dielectric 204 under opening 220a is exposed and control gates 206b and doped oxide patterns 208b are formed, as shown in FIG. 8. As can be seen in FIG. 8, control gates 206b are form above portions 205 of substrate 202, as indicated by the dashed lines. Opening 220a now extends through the etched portions of doped oxide patter 208a and conductive pattern 206a to the exposed surface of gate dielectric 204. In the mean time, sacrificial layer 218 is also partially etched. To facilitate illustration, the term "inner sidewall" is used hereinafter when a sidewall of a structure, such as doped oxide pattern 208b or control gate 206b, inside opening 220a is referred to. Conversely, if a sidewall of a structure outside opening 220a is referred to, the term "outer sidewall" is used. Further, it is to be understood that, although the shape or size of opening 220a changes after each processing step, the same numeral reference, 220a, is used hereinafter for conveniences of illustration.

Figure 9:
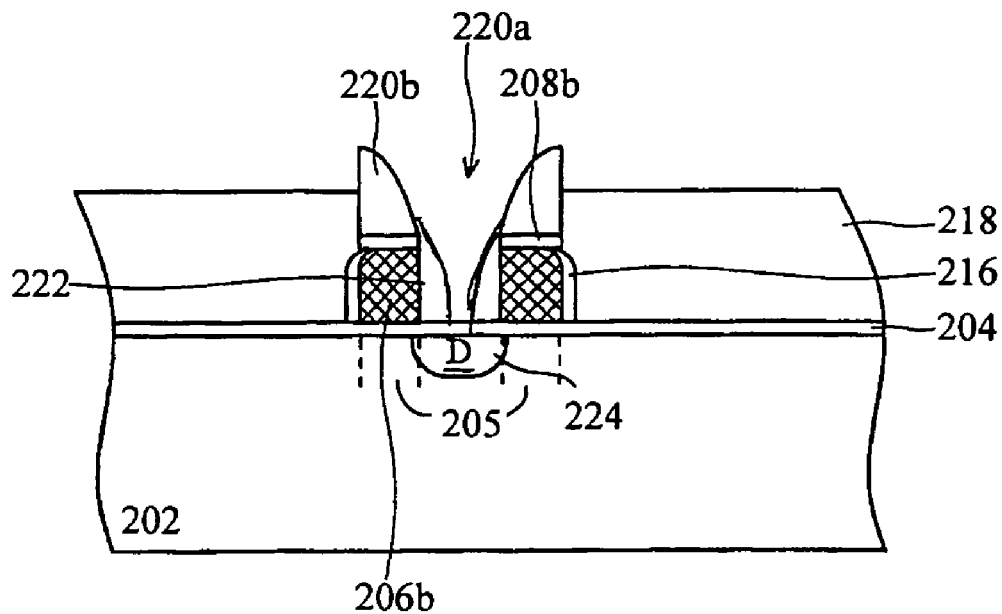

Referring to FIG. 9, spacers 222 are formed on inner sidewalls of control gates 206b. Spacers 222 may be formed by first depositing and then patterning a layer of silicon nitride above the entire surface of the resultant structure. In one aspect, spacers 222 fully cover the inner sidewalls of control gates 206b. After the formation of spacers 222, ions are implanted into substrate 202 through opening 220a. A drain region 224 is then formed by diffusion.

Figure 10:
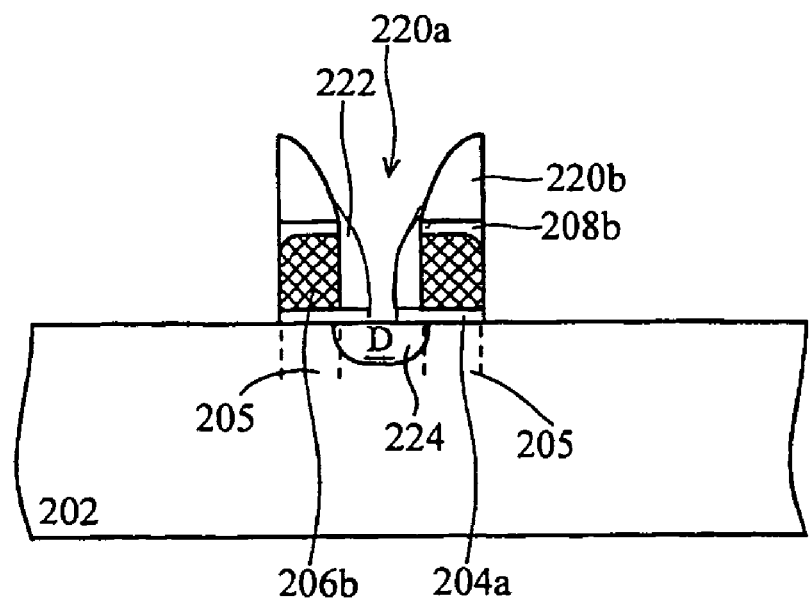

Referring to FIG. 10, using spacers 220b and spacers 222 as an etching mask, gate dielectric 204, sacrificial layer 218, and oxide 216 are removed, exposing substrate 202. Portions of control gate 206b may also be etched simultaneously.

Figure 11:
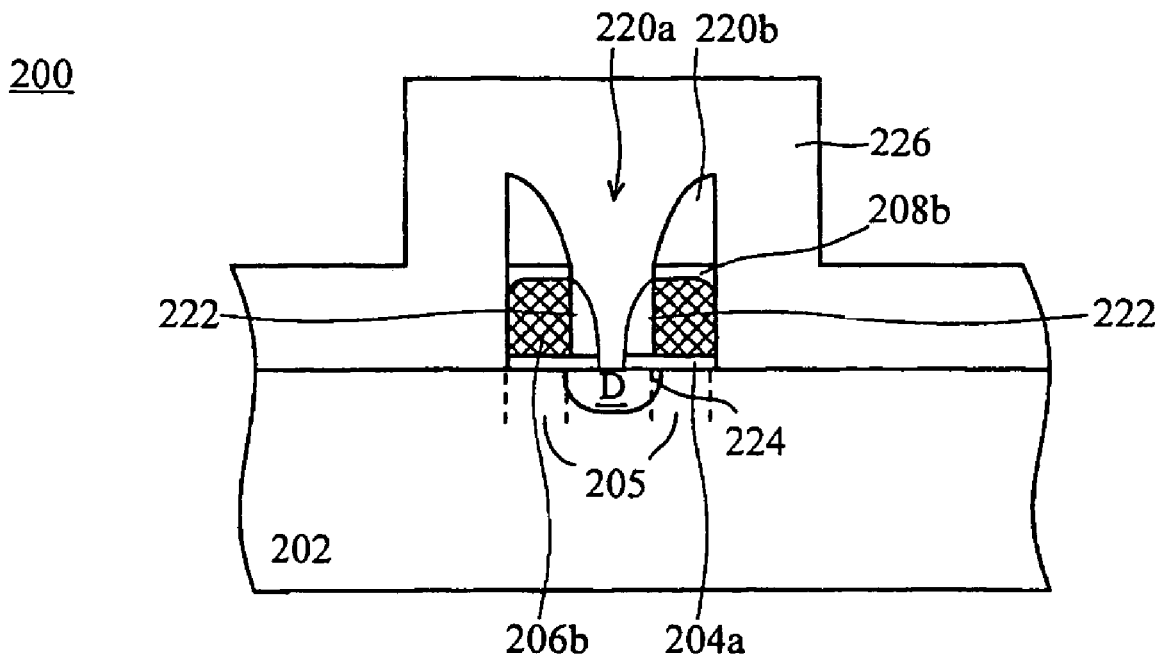

Referring to FIG. 11, an insulating layer 226 is provided above the entire surface of the resultant structure. In one aspect, insulating layer 226 comprises a different material than spacers 220b and 222, such that an etching speed of insulating layer 226 is faster than that of spacers 220b and 222. For example, insulating layer 226 may comprise silicon oxide.

Figure 12:
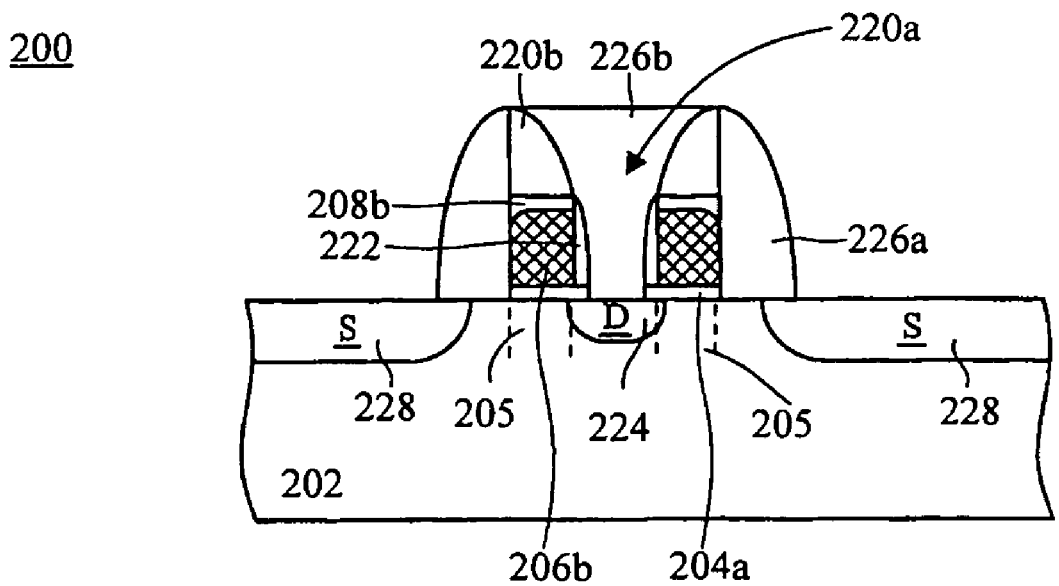

Referring to FIG. 12, an anisotropic etching is performed to etch insulating layer 226, exposing the surface of substrate 202. As a result, spacers 226a are formed on outer sidewalls of spacers 220b, doped oxide patterns 208b, control gates 206b, and gate dielectric patterns 204a. Also, a portion of insulating layer 226, i.e., a filling 226b, remains in opening 220a. In one aspect, the anisotropic etching of insulating layer 226 comprises plasma etching or RIE. Following the anisotropic etching of insulating layer 226, steps of ion implantation and dopant diffusion are performed to form source regions 228. During the ion implantation, spacers 226a and filling 226b are used as a mask, as shown in FIG. 12.

Figure 13:
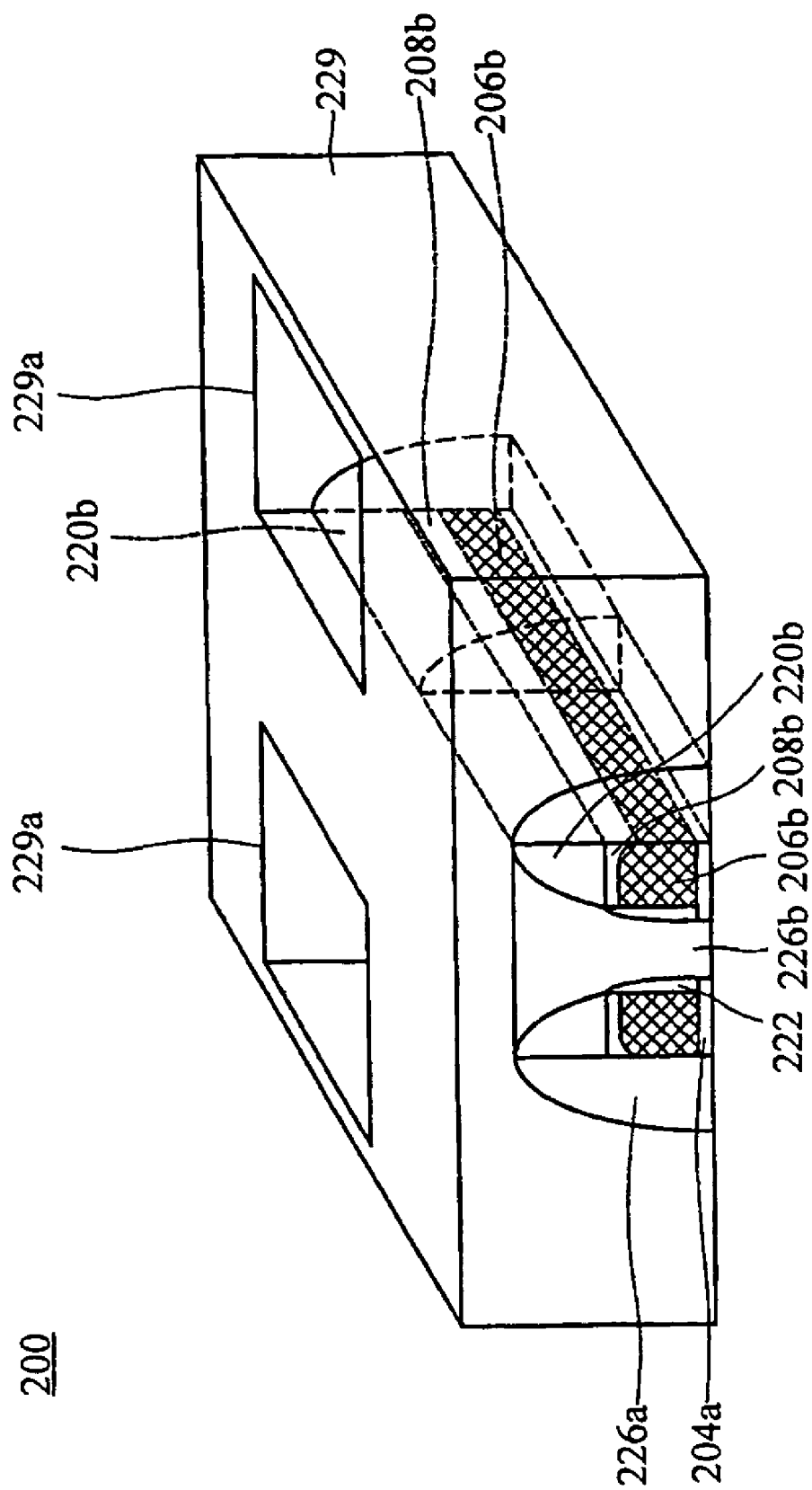

Next, spacers 226a are partially removed using a patterned photoresist 229. FIG. 13 shows a 3-D view of the portion of flash memory 200 above the surface of substrate 202 as covered by photoresist 229. As shown in FIG. 13, photoresist 229 has a plurality of openings 229a through which portions of spacers 226a are exposed. After the exposed portions of spacers 226a are etched away, patterned photoresist 229 is removed.

Figure 14:
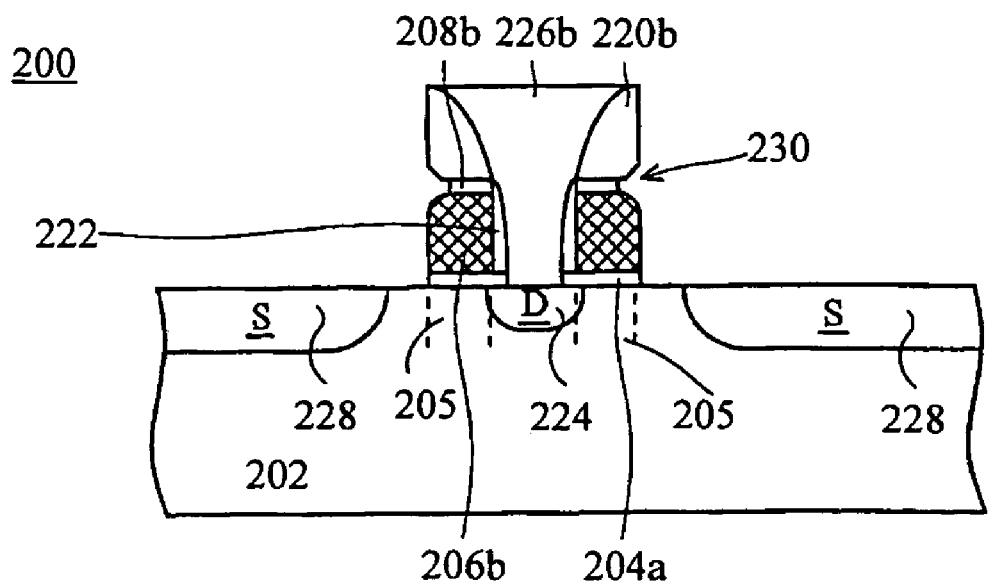

Then, as shown in FIG. 14, doped oxide patterns 208b are partially etched from the sides thereof using spacers 220b and filling 226b as an etching mask. Due to the etching selectivity between doped oxide patterns 208b and control gates 206b, recesses 230 are formed at edges of doped oxide patterns 208b. As shown in FIG. 14, each recess 230 has an acute angle. In one aspect, the etching of doped oxide patterns 208b comprises an etching using an HF solution, or an etching using $CF_4$ or $CHF_3$ as reactive gases.

Figure 15:
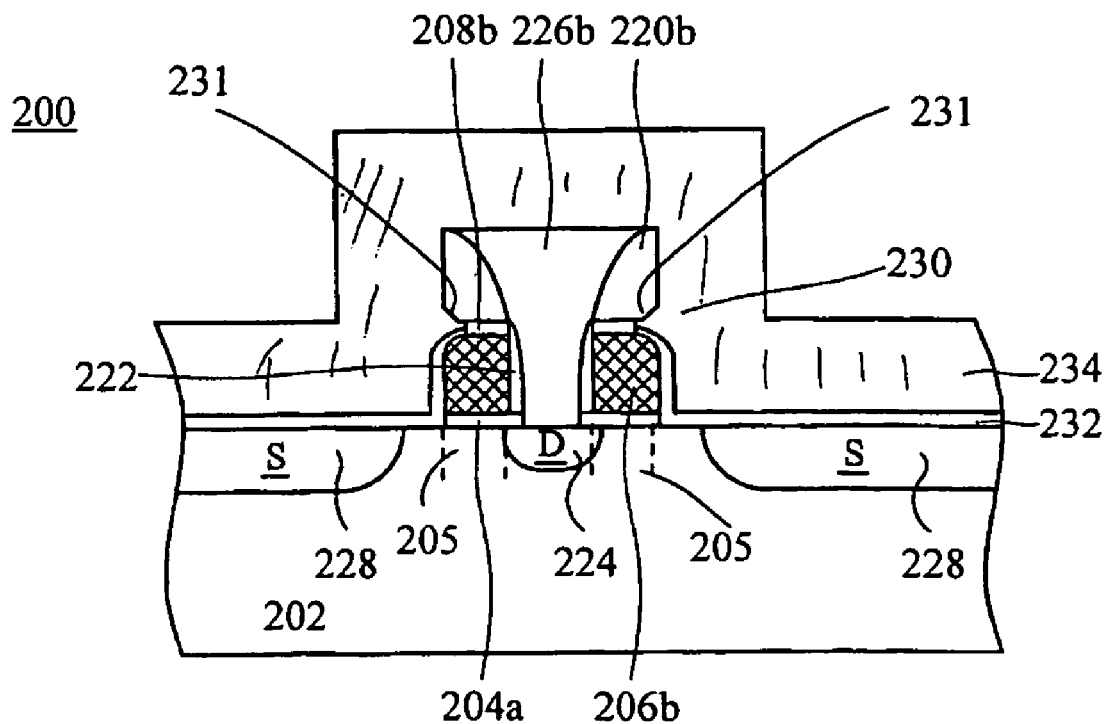

Referring to FIG. 15, a layer of dielectric 232 is provided above the entire surface of the resultant structure. In one aspect, dielectric layer 232 comprises oxide. In another aspect, dielectric layer 232 is formed by thermal oxidation. Dielectric layer 232 covers exposed surface of substrate 202 and outer sidewalls of control gates 206b. The portions of layer 232 that covers the outer sidewalls of control gates 206b may also be considered spacers. A conductive layer 234 is then deposited above the entire surface of the resultant structure. In one aspect, conductive layer 234 comprises polysilicon. As shown in FIG. 15, conductive layer 234 includes a plurality of projections 231 formed in recesses 230. Specifically, projection 231 are formed in vertical alignment above a part of portions 205 of substrate 202.

Figure 16:
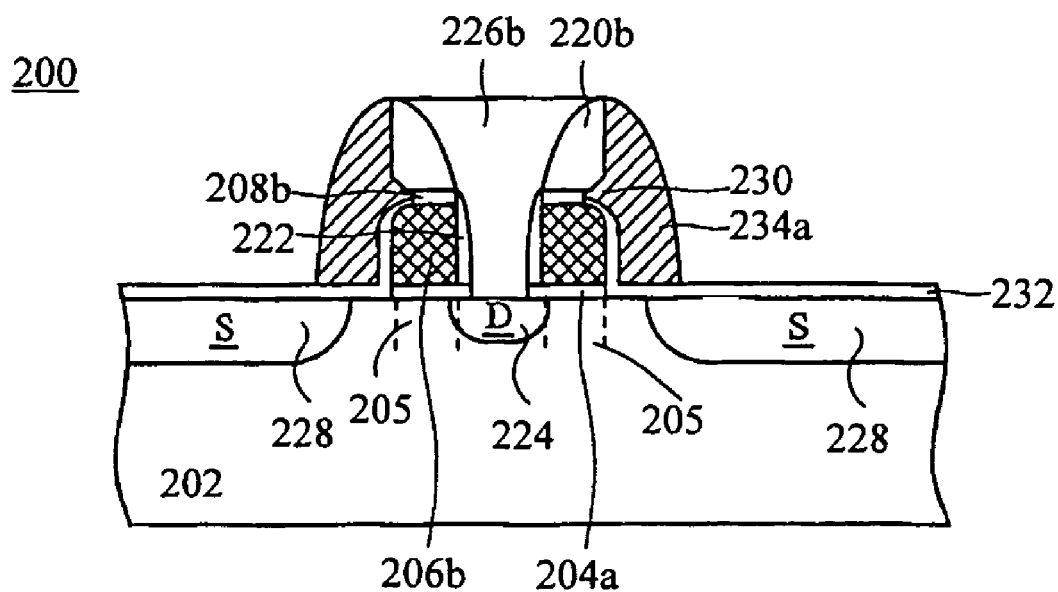

Conductive layer 234 is then etched to form floating gates 234a, or spacer floating gates 234a, as shown in FIG. 16. Floating gates 234a are formed on the outer sidewalls of spacers 220b and are isolated from control gates 206b by dielectric 232.

Figure 17:
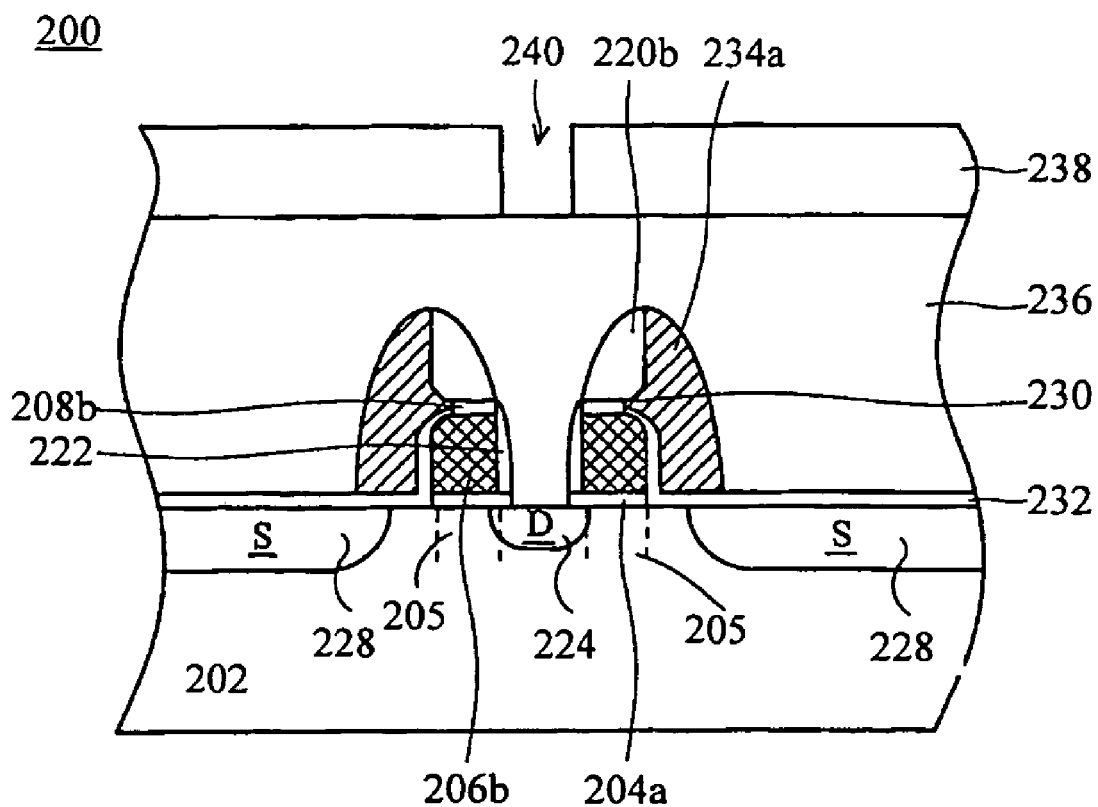

After floating gates 234a are formed, an interlayer dielectric (ILD) layer 236 is deposited above the entire surface of the resultant structure, as shown in FIG. 17. In one aspect, ILD layer 236 comprises silicon oxide. A layer of photoresist 238 is provided above ILD 236 and patterned, wherein an opening 240 in photoresist 238 is aligned to opening 220a.

Figure 18:
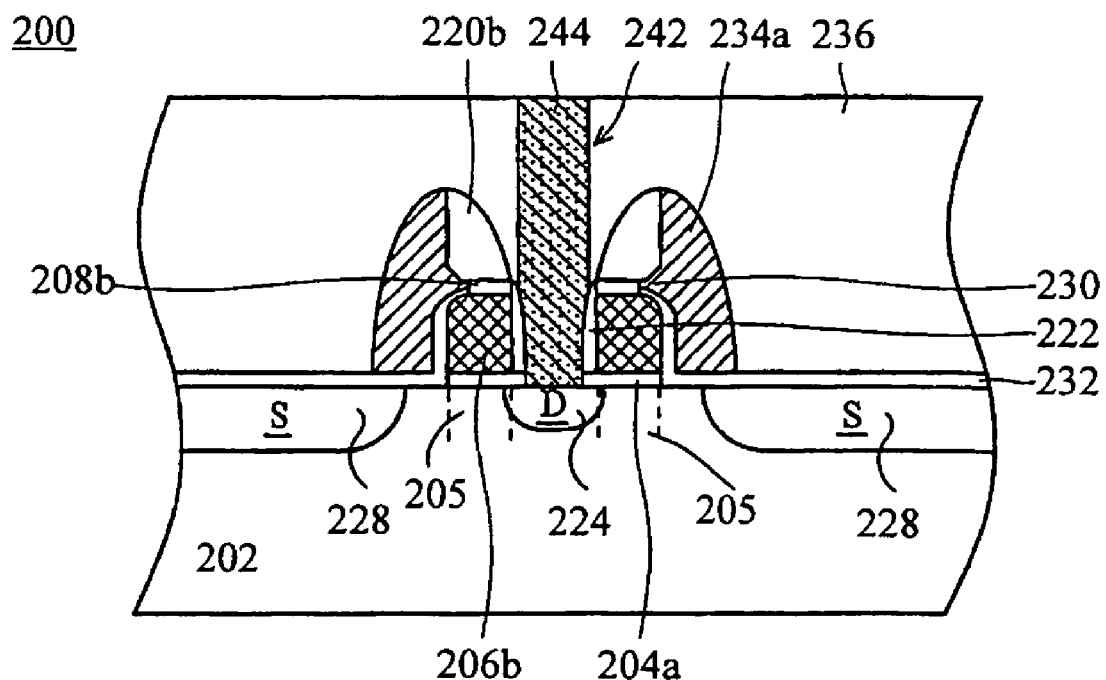

Finally, using patterned photoresist 238 as an etching mask, ILD layer 236 is etched to expose drain region 224, as shown in FIG. 18. A via hole 242 is thus formed in ILD 236. After photoresist 238 is removed, a bit line 244 is formed through via hole 242 to provide an electrical contact to drain region 224. In one aspect, bit line 244 may comprise at least one of tungsten, copper, aluminum, and polysilicon.

Figure 19:
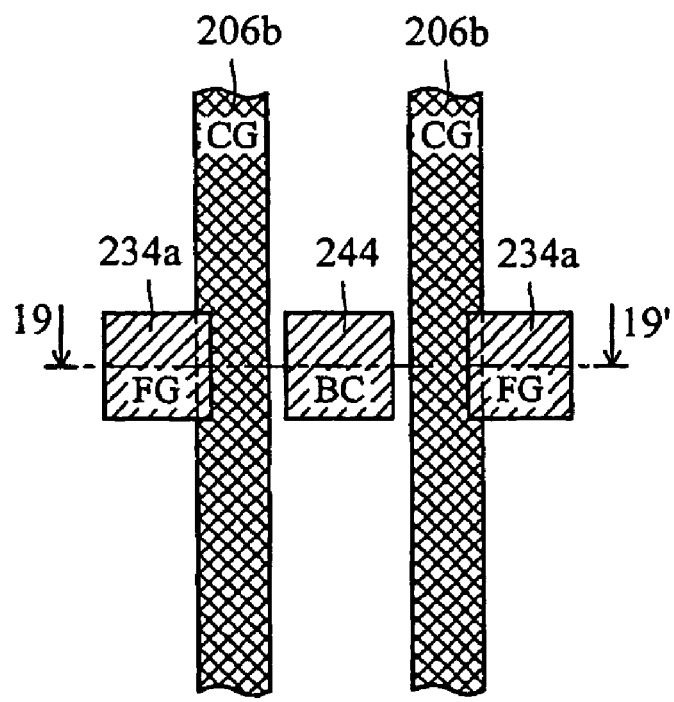
FIG. 19 shows an top view of the relative positions of bit line contacts, floating gates, and control gates of a flash memory device consistent with the present invention.

FIG. 19 illustrates a top view of the relative positions of bit line 244, control gates 206b, and floating gates 234a, wherein FIGS. 14-18 are cross-sectional views across line 19-19' in FIG. 19. As shown in FIG. 19, each floating gate 234a abovelaps a respective control gate 206b. Therefore, a chip area of each memory cell of flash memory 200 is substantially reduced. Also, because bit line 244 is formed using spacers 220b and 222 (FIG. 18) as a mask and is therefore self-aligned, there is no misalignment during the photolithography step. Thus, a distance between bit line contact 244 and control gates 206b may be reduced without incurring the problem of a short circuit. Further, the projections of floating gates 234a formed in recesses 230 provide a means for point discharge during erasure operation of memory 200. Therefore, memory 200 may be erased in a shorter time than conventional flash memory devices.

It will be apparent to those skilled in the art that various modifications and variations can be made in the disclosed structures and methods without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of forming a flash memory, comprising
providing a substrate;
forming a layer of gate dielectric;
forming a plurality of composite structures above the gate dielectric, each composite structure including a first conductive pattern, a doped oxide pattern, and a nitride pattern;
removing the nitride pattern in each composite structure;
partially etching the first conductive patterns and the doped oxide patterns, thereby forming two control gates out of each first conductive pattern;
forming a plurality of first spacers each on a first sidewall of one of the control gates, wherein each first spacer fully covers the first sidewall of the corresponding control gate;
forming a plurality of second spacers each on a second sidewall of one of the control gates after the two control gates are formed;
partially removing the plurality of second spacers to expose a side of the doped oxide pattern and a portion of each control gate;
forming a plurality of third spacers on the exposed portions of the control gates;
forming a plurality of floating gates on the third spacers; and
forming each of a plurality of bit line contacts between every two control gates formed out of one first conductive pattern.

2. The method of claim 1, wherein forming a plurality of composite structures comprises
forming a first conductive layer above the gate dielectric;
forming a layer of doped oxide above the first conductive layer;
forming a layer of nitride above the layer of doped oxide; and
patterning the nitride, the doped oxide, and the first conductive layer.

3. The method of claim 1, further comprising
   isotropically etching the doped oxide pattern of each composite structure to create a plurality of first recesses at edges of the doped oxide pattern prior to removing the nitride pattern in each composite structure; and
   forming a layer of oxide on sidewalls of each first conductive pattern, wherein the layer of oxide includes a bird's beak formed in a respective first recess.

4. The method of claim 1, wherein providing a substrate comprises providing the substrate as a semiconductor substrate.

5. The method of claim 1, wherein forming a plurality of composite structures comprises forming each of the plurality of composite structures to include the first conductive pattern as a pattern of a metal layer or a polysilicon layer.

6. The method of claim 1, wherein forming the first spacers comprises forming the first spacers as silicon nitride spacers.

7. The method of claim 1, wherein forming the second spacers comprises forming the second spacers as silicon nitride spacers.

8. The method of claim 1, wherein forming the third spacers comprises forming the third spacers as silicon oxide spacers.

9. The method of claim 1, wherein forming the bit line contacts includes forming the bit line contacts as comprising copper, tungsten, aluminum, or polysilicon.

10. The method of claim 1, wherein removing the nitride pattern in each composite structure comprises
   depositing a sacrificial layer above the gate dielectric and the composite structures;
   polishing the sacrificial layer to expose the nitride pattern of each composite structure; and
   removing the nitride pattern in each composite structure by plasma etching or reactive ion etching to expose the doped oxide patterns, forming a plurality of first openings in the sacrificial layer.

11. The method of claim 10, wherein partially etching the first conductive patterns and the doped oxide patterns comprises
   depositing a first insulating layer above the sacrificial layer and the exposed doped oxide patterns;
   anisotropically etching the first insulating layer to expose the doped oxide patterns, forming a plurality of fourth spacers on sidewalls of the first openings; and
   using the fourth spacers as an etching mask, etching the doped oxide patterns and the first conductive patterns to form the control gates.

12. The method of claim 1, wherein forming the plurality of first spacers each on the first sidewall of one of the control gates comprises:
   depositing a layer of nitride above the control gates and the substrate; and
   patterning the layer of nitride to form the first spacers.

13. The method of claim 12, further comprising forming a plurality of drain regions by implanting ions using the first spacers and the control gates as a mask.

14. The method of claim 1, wherein forming a plurality of second spacers comprises
   depositing a layer of nitride above the control gates and the substrate; and
   patterning the layer of nitride to form the second spacers.

15. The method of claim 14, further comprising forming a plurality of source regions by implanting ions using the second spacers as a mask.

16. The method of claim 1, further comprising etching a side of the doped oxide patterns to create a plurality of recesses at the edge of each doped oxide pattern prior to forming the third spacers.

17. The method of claim 16, wherein each of the floating gates includes a projection formed in a corresponding one of the recesses.

* * * * *